United States Patent
Nakajima

(10) Patent No.: US 10,704,953 B2
(45) Date of Patent: Jul. 7, 2020

(54) LIGHT DETECTING APPARATUS AND IMAGE ACQUIRING APPARATUS

(71) Applicant: Olympus Corporation, Hachioji-shi, Tokyo (JP)

(72) Inventor: Keiichiro Nakajima, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 16/352,046

(22) Filed: Mar. 13, 2019

(65) Prior Publication Data

US 2019/0212193 A1 Jul. 11, 2019

Related U.S. Application Data

(63) Continuation of application No. PCT/JP2016/083117, filed on Nov. 8, 2016.

(51) Int. Cl.
*H04N 5/347* (2011.01)
*H01L 27/146* (2006.01)
(Continued)

(52) U.S. Cl.
CPC .......... *G01J 1/44* (2013.01); *H01L 27/14609* (2013.01); *H04N 5/37457* (2013.01);
(Continued)

(58) Field of Classification Search
CPC .................. G01J 1/44; G01J 2001/446; G01J 2001/4466; H01L 27/14609;
(Continued)

(56) References Cited

U.S. PATENT DOCUMENTS 7,002,881 B2 * 2/2006 Okuda ................... G11B 7/005
369/124.01
7,408,143 B2 * 8/2008 Yokoyama ............... H03F 3/08
250/201.5
(Continued)

FOREIGN PATENT DOCUMENTS

JP 47-035745 11/1972
JP 05-034714 5/1993
(Continued)

OTHER PUBLICATIONS

International Search Report and Written Opinion from corresponding International Application No. PCT/JP2016/083117, dated Jan. 24, 2017.

*Primary Examiner* — Ngoc Yen T Vu
(74) *Attorney, Agent, or Firm* — Krithiga Ganesan

(57) ABSTRACT

The disclosed technology is directed to a light detecting apparatus used in an image acquiring apparatus. The image acquiring apparatus comprises a light receiving element that outputs a current according to a light amount of incident light. A current-voltage conversion circuit converts the current output from the light receiving element to a voltage signal. The current-voltage conversion circuit includes an operational amplifier and feedback resistance, feedback capacitance, and at least one diode that are connected in parallel between an inverting terminal and an output terminal of the operational amplifier. The diode is connected to have a forward direction from the inverting terminal toward the output terminal, and following conditional expressions are satisfied, $G=R_f$, $B=1/(2\pi R_f(C_f+C_d/n))$ and $V_{pr} > n \times V_f > G \times I_{max}$.

8 Claims, 4 Drawing Sheets

(51) Int. Cl.
*G01J 1/44* (2006.01)
*H04N 9/64* (2006.01)
*H04N 5/3745* (2011.01)

(52) U.S. Cl.
CPC .............. *H04N 9/646* (2013.01); *H04N 9/647* (2013.01); *H04N 9/648* (2013.01); *G01J 2001/4466* (2013.01); *H01L 27/14689* (2013.01); *H04N 5/3745* (2013.01)

(58) Field of Classification Search
CPC .............. H01L 27/14643; H01L 27/27; H01L 27/14689; H04N 5/374; H04N 5/3745; H04N 5/37457; H04N 9/64; H04N 9/647; H04N 9/648; H04N 3/1512
See application file for complete search history.

(56) References Cited

U.S. PATENT DOCUMENTS

| | | | |
|---|---|---|---|
| 7,442,913 B2* | 10/2008 | Fukuda | H03F 1/34 |
| | | | 250/214 A |
| 10,009,565 B2* | 6/2018 | Sonoda | H04N 5/3745 |
| 2003/0231574 A1 | 12/2003 | Okuda et al. | |
| 2010/0210952 A1 | 8/2010 | Taira et al. | |
| 2013/0181111 A1* | 7/2013 | Jahana | G01J 1/44 |
| | | | 250/206 |
| 2018/0372848 A1* | 12/2018 | Otsuka | G01S 17/10 |

FOREIGN PATENT DOCUMENTS

| | | |
|---|---|---|
| JP | 11-145913 | 5/1999 |
| JP | 2004-022051 | 1/2004 |
| JP | 2010-099095 | 5/2010 |
| JP | 2016-057254 | 4/2016 |

\* cited by examiner

LIGHT DETECTING APPARATUS AND IMAGE ACQUIRING APPARATUS

CROSS-REFERENCE TO RELATED APPLICATION

This application is a continuation application of PCT Application No. PCT/JP2016/083117 filed on Nov. 8, 2016, which is hereby incorporated by reference in its entirety.

TECHNICAL FIELD

The disclosed technology relates to a light detecting apparatus and an image acquiring apparatus.

DESCRIPTION OF THE RELATED ART

In the case of two-dimensionally carrying out scanning on a subject with laser spot light with which the subject is irradiated and detecting reflected light that returns from each scanning position by a photoelectric conversion element to turn the reflected light to an image as in a laser scanning endoscope, the intensity of the reflected light depends on the subject. If the subject has high reflectance, the photoelectric conversion element and an electrical circuit at the subsequent stage thereof need to treat a light amount having a six-digit dynamic range of 10 nW to 10 mW. In this case, if the light amount of reflected light is an excessive light amount (for example, 10 μW or higher) that surpasses a normal range, it is preferable for the image to exhibit blown-out highlights based on halation.

However, in the case of carrying out irradiation with illumination light based on a sequential pulse lighting system, or a time division multiplexing (TDM) system, there is inconvenience that a phase inversion phenomenon occurs in an UV amplifier that is the electrical circuit at the subsequent stage of the photoelectric conversion element and a false color occurs in the generated image as a result.

The disclosed technology is made in view of the circumstances described hereinbefore and intends to provide a light detecting apparatus and an image acquiring apparatus that can output a detection signal with magnitude according to the light amount when a light having a normal light amount is incident and prevent the occurrence of a phase inversion phenomenon when a light having an excessive light amount that surpasses the normal light amount is incident.

BRIEF SUMMARY OF EMBODIMENTS

One aspect of the disclosed technology is a light detecting apparatus including a light receiving element that outputs a current according to the light amount of incident light and a current-voltage conversion circuit that converts the current output from the light receiving element to a voltage signal. The current-voltage conversion circuit includes an operational amplifier and feedback resistance, feedback capacitance, and at least one diode that are connected in parallel between an inverting terminal and an output terminal of the operational amplifier. The diode is connected to have a forward direction from the inverting terminal toward the output terminal, and the following conditional expressions are satisfied.

$$G = R_f \quad (1)$$

$$B = 1/(2\pi R_f (C_f + C_d/n)) \quad (2)$$

$$V_{pr} > n \times V_f > G \times I_{max} \quad (3)$$

Here, G is the transimpedance gain of the current-voltage conversion circuit. $R_f$ is the resistance value of the feedback resistance. B is a desired band frequency. $C_f$ is the capacitance value of the feedback capacitance. $C_d$ is the capacitance value of the diode. n is the number of diodes. $V_{pr}$ is a voltage at which the operational amplifier causes an abnormality. $V_f$ is the forward voltage of the diode. $I_{max}$ is a current value output from the light receiving element when a light having the maximum value of a light amount desired to be detected is incident.

According to the present aspect, when light in a light amount range desired to be detected is incident on the light receiving element, the current according to the light amount of the incident light is output from the light receiving element and is converted to the voltage signal by the current-voltage conversion circuit. Specifically, when a current with the current value $I_{max}$ or smaller is input to the inverting terminal of the operational amplifier, as represented in expression (1), a voltage obtained by current-voltage conversion with the transimpedance gain corresponding with the magnitude of the feedback resistance connected between the inverting terminal and the output terminal is output.

At this time, the voltage that appears at the output terminal is lower than the forward voltage of the diode due to expression (3) and the diode is in the cut-off state. Thus, the operational amplifier circuit becomes an amplification circuit of a simple low-pass filter type composed of the feedback resistance and the capacitive elements (feedback capacitance and the capacitance of the diode) connected in parallel between the inverting terminal and the output terminal of the operational amplifier, and becomes an amplification circuit with the transimpedance gain G that can amplify a current value with a frequency equal to or lower than the band frequency B represented in expression (2).

Therefore, with consideration of the capacitance value $C_d$ of the diode, the transimpedance gain G can be selected to be as high as possible, and the band frequency B can be caused to substantially correspond with the maximum value of the signal frequency of light, so that the signal-to-noise ratio of the output voltage signal can be improved.

On the other hand, when a current that surpasses the current value $I_{max}$ is input to the inverting terminal of the operational amplifier and the voltage that appears at the output terminal reaches the forward voltage $V_f$ of the diode, the diode becomes conductive. Thus, the output voltage is clipped to the forward voltage $V_f$ even when a current larger than it is input. From expression (3), the forward voltage $V_f$ is lower than the voltage $V_{pr}$ at which the operational amplifier causes an abnormality. Therefore, abnormal operation of the operational amplifier, i.e. the phase inversion phenomenon, can be prevented.

In the aspect described hereinbefore, a plurality of the diodes may be connected in series.

By doing this, when n (n≥2) diodes are connected in series, from expression (2), the influence given to the band frequency B by the capacitance value $C_d$ of the diode can be reduced to 1/n. That is, because the capacitance of the diode involves manufacturing variation, variation in the band frequency B due to the manufacturing variation can be prevented by connecting the diodes in series.

As a result, it is possible to more surely prevent distortion in a high frequency band attributed to the lowering of the band frequency B beyond the signal frequency band of light desired to be detected due to the variation and the lowering of the signal-to-noise ratio due to increase in the band frequency B and amplification of a current of a high frequency band beyond necessity.

Furthermore, another aspect of the disclosed technology is an image acquiring apparatus including any kind of a light detecting apparatus described hereinbefore and the image processing portion that generates an image based on the voltage signal output from the light detecting apparatus.

According to the present aspect, the occurrence of a false color is prevented due to prevention of the phase inversion phenomenon and an image with less noise and high resolution can be acquired.

The disclosed technology provides an effect that it is possible to output a detection signal with magnitude according to the light amount when a light having a normal light amount is incident and prevent the occurrence of the phase inversion phenomenon when a light having an excessive light amount that surpasses the normal light amount is incident.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

DETAILED DESCRIPTION OF THE EMBODIMENTS

In the following description, various embodiments of the technology will be described. For purposes of explanation, specific configurations and details are set forth in order to provide a thorough understanding of the embodiments. However, it will also be apparent to one skilled in the art that the technology disclosed herein may be practiced without the specific details. Furthermore, well-known features may be omitted or simplified in order not to obscure the embodiment being described.

A light detecting apparatus 4 and an image acquiring apparatus 1 according to one embodiment of the disclosed technology will be described below with reference to the drawings.

Figure 1:
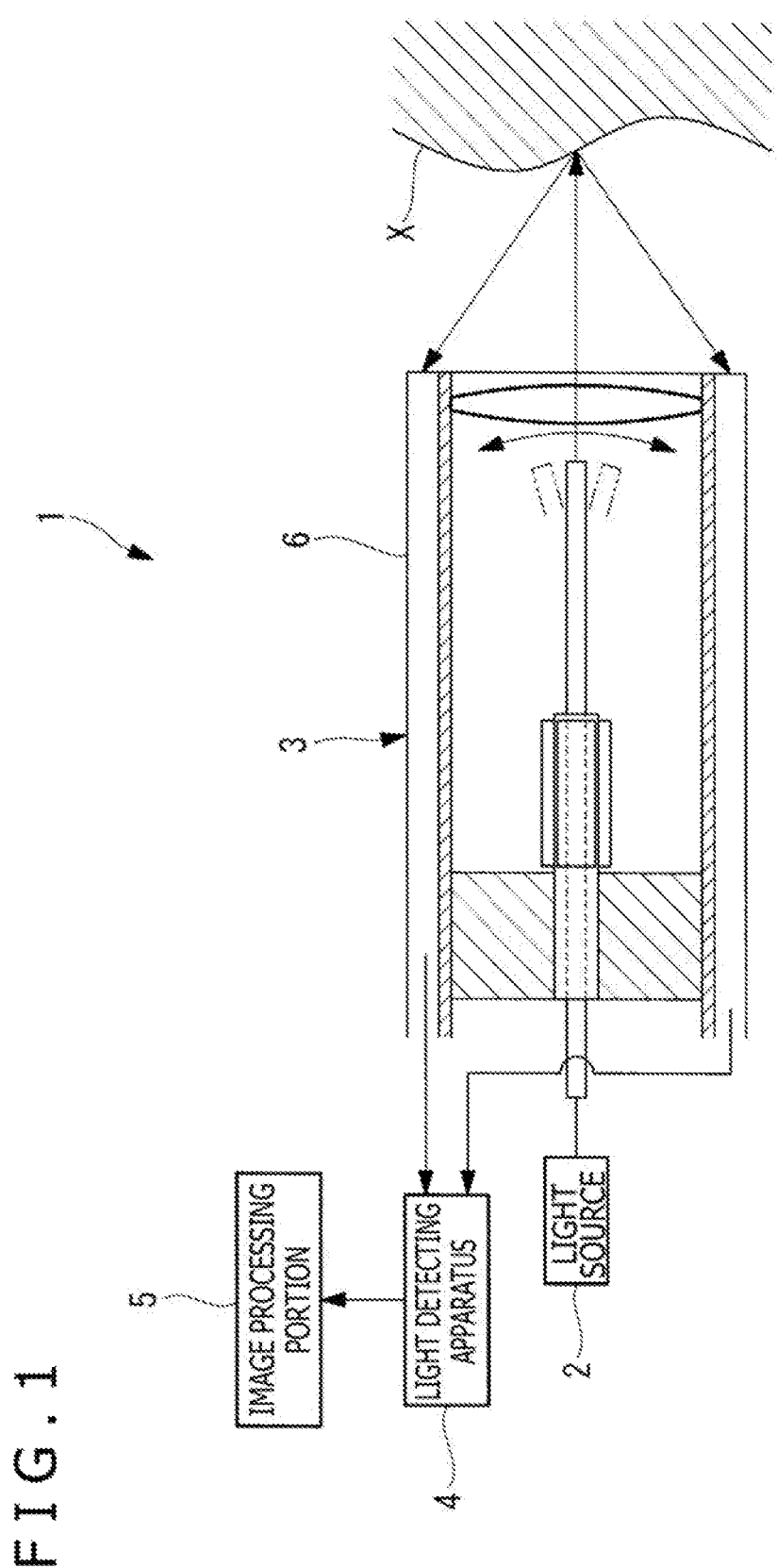
FIG. 1 is an overall configuration diagram representing an image acquiring apparatus according to one embodiment of the disclosed technology.

As represented in FIG. 1, the image acquiring apparatus 1 according to the present embodiment includes an illumination optical system 3 that irradiates a subject X with illumination light of a spot manner from a light source 2, the light detecting apparatus 4 according to the present embodiment that detects reflected light, at the subject X, of the illumination light with which the irradiation is carried out by this illumination optical system 3, and an image processing portion 5 that generates an image based on light detected by this light detecting apparatus 4.

The illumination light has a light amount of approximately 10 mW, for example, and the reflected light from the subject X is normally in a range of 10 nW to 10 μW. However, if the reflectance of the subject X is high, reflected light with a light amount of 10 mW equivalent to the light amount of the illumination light is often received by a light receiving portion 6.

The image processing portion 5 generates an image based on the light amount of the reflected light detected by the light detecting apparatus 4 and information on the irradiation position of the illumination light.

Figure 2:
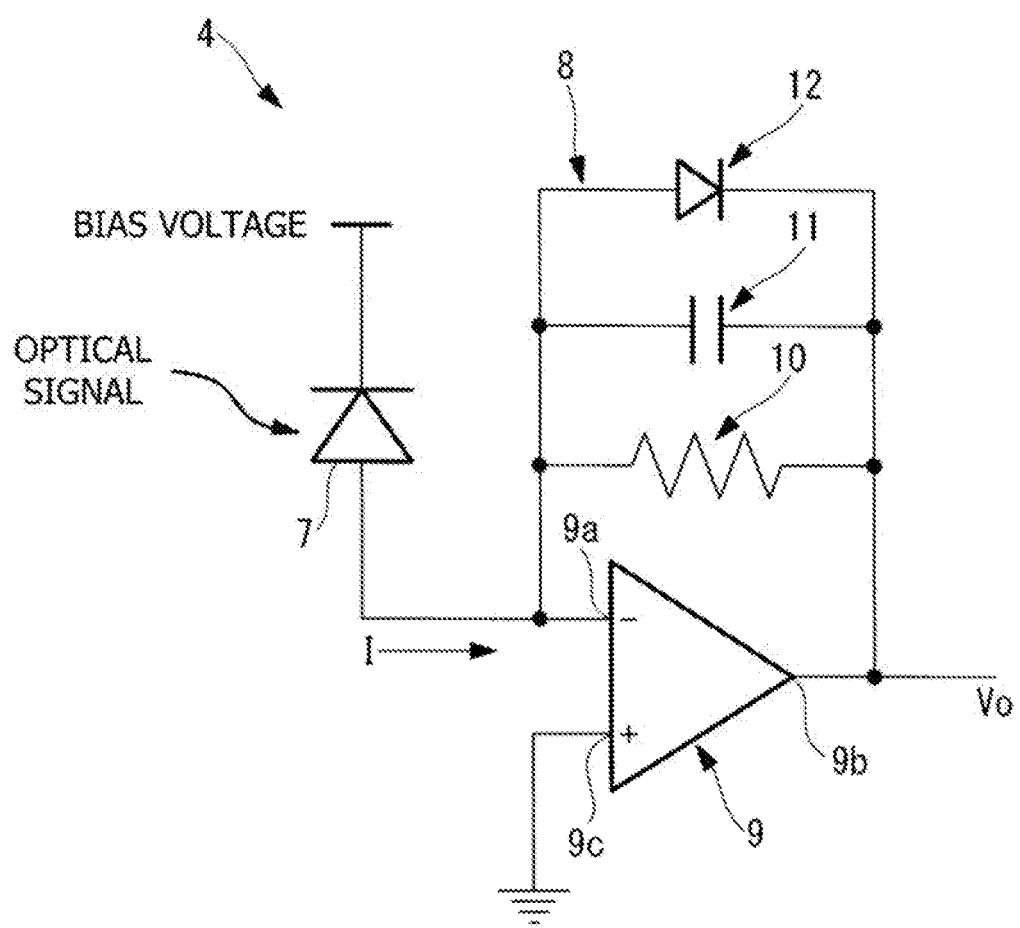
FIG. 2 is a circuit diagram representing a light detecting apparatus according to the present embodiment included in the image acquiring apparatus of FIG. 1.

As represented in FIG. 2, the light detecting apparatus 4 according to the present embodiment includes a light receiving element 7 that receives the reflected light from the subject X and a current-voltage conversion circuit 8 that converts a current output by this light receiving element 7 to a voltage. The light receiving element 7 is an avalanche photodiode, for example, and outputs a current with magnitude according to the light amount of reflected light through incidence of the reflected light thereon.

The current-voltage conversion circuit 8 includes an operational amplifier 9 and feedback resistance 10, feedback capacitance 11, and at least one diode 12 that are connected in parallel between an inverting terminal 9a and an output terminal 9b of this operational amplifier 9.

To a non-inverting terminal 9c of the operational amplifier 9, 0 V, or a ground (GND), is connected as a reference voltage.

The diode 12 is connected to have the forward direction from the inverting terminal 9a of the operational amplifier 9 toward the output terminal 9b.

Furthermore, the current-voltage conversion circuit 8 satisfies the following conditional expressions (1) to (3).

$$G = R_f \quad (1)$$

$$B = 1/(2\pi R_f(C_f + C_d/n)) \quad (2)$$

$$V_{pr} > n \times V_f > G \times I_{max} \quad (3)$$

Here, G is the transimpedance gain of the current-voltage conversion circuit 8. $R_f$ is the resistance value of the feedback resistance 10. B is the desired band frequency. $C_f$ is the capacitance value of the feedback capacitance 11. $C_d$ is the capacitance value of the diode 12. n is the number of diodes 12. $V_{pr}$ is a voltage at which the operational amplifier 9 causes an abnormality. $V_f$ is the forward voltage of the diode 12. $I_{max}$ is a current value output from the light receiving element 7 when a light having the maximum value of the light amount desired to be detected is incident. In the present embodiment, the number n of diodes 12=1.

Operation of the light detecting apparatus 4 and the image acquiring apparatus 1 according to the present embodiment configured in this manner will be described below.

In the case of detecting reflected light from the subject X using the light detecting apparatus 4 according to the present embodiment, the subject X is irradiated with illumination light from the light source 2 and reflected light from the subject X is caused to be detected by the light receiving element 7 of the light detecting apparatus 4.

When the reflected light is incident on the light receiving element 7, a current with magnitude according to the light amount of the reflected light is output from the light receiving element 7.

In the following, a description will be made separately between the case in which the light amount of the reflected light is in a normal light amount range and the case in which the light amount of the reflected light is an excessive amount that surpasses the normal light amount range.

First, in the case in which the light amount of the reflected light is in the normal light amount range, when the reflected light is made incident on the light receiving element 7 and the current with magnitude according to the light amount of the reflected light is output, the output current cannot flow into the inverting terminal 9a of the operational amplifier 9 and flows to the feedback resistance 10. At this time, when the current value is defined as I, a voltage drop of $R_f \times I$ arises between the inverting terminal 9a and the output terminal 9b. Because the non-inverting terminal 9c is at the reference voltage 0 V, the potential of the inverting terminal 9a also becomes the same position (0 V) due to virtual short and an output voltage $V_O$ becomes $V_O = -I \times R_f$.

A combined capacitance value $C_f + C_d$ of the capacitance value $C_f$ of the feedback capacitance 11 and the capacitance value $C_d$ of the diode 12 contributes to stabilization of the operation of the operational amplifier 9 and obtainment of the desired band frequency B. If the light amount of the reflected light is in the normal light amount range, from expression (3), the voltage drop between the inverting terminal 9a and the output terminal 9b does not reach the forward voltage of the diode 12. Thus, the diode 12 is kept at the cut-off state and a voltage with magnitude according to the current value of the current input to the inverting terminal 9a is output from the operational amplifier 9.

In this case, in the state in which the diode 12 is cut off, the operational amplifier circuit becomes an amplification circuit of a simple low-pass filter type composed of the feedback resistance 10 and the capacitive elements (feedback capacitance 11 and the capacitance of the diode 12) connected in parallel between the inverting terminal 9a and the output terminal 9b of the operational amplifier 9, and becomes an amplification circuit with the transimpedance gain G that can amplify a current value with a frequency equal to or lower than the band frequency B represented in expression (2).

Therefore, with consideration of the capacitance value $C_d$ of the diode 12, the transimpedance gain G can be selected to be as high as possible, and the band frequency B can be caused to substantially correspond with the maximum value of the signal frequency of light, so that the signal-to-noise ratio of the output voltage $V_O$ can be improved.

Next, in the case in which the light amount of the reflected light surpasses the normal light amount range, due to the flowing of the current output from the light receiving element 7 to the feedback resistance 10, the diode 12 becomes conductive at the timing when the voltage drop between the inverting terminal 9a and the output terminal 9b reaches the forward voltage $V_f$. Thus, the output voltage $V_O$ is clipped around the forward voltage $V_f$. Therefore, from then on, the output voltage $V_O$ does not surpass the forward voltage $V_f$ even when the current output from the light receiving element 7 becomes larger, and does not reach the voltage $V_{pr}$, at which the operational amplifier 9 causes an abnormality, from expression (3). As a result, even when an excessive current is input, the operational amplifier 9 is prevented from causing a phase inversion phenomenon.

As described hereinbefore, according to the light detecting apparatus 4 in accordance with the present embodiment, there is an advantage that the light detecting apparatus 4 can output a detection signal with magnitude according to the light amount when the reflected light in the normal light amount range is incident and prevent the occurrence of the phase inversion phenomenon when the reflected light with an excessive light amount that surpasses the normal light amount range is incident. Furthermore, there is an advantage that the signal-to-noise ratio of the output voltage $V_O$ can be improved by selecting as large a value as possible as the transimpedance gain G and causing the band frequency B to substantially correspond with the maximum value of the signal frequency of light.

Furthermore, according to the image acquiring apparatus 1 in accordance with the present embodiment, by including the light detecting apparatus 4 according to the present embodiment, the image acquiring apparatus 1 can prevent the occurrence of a false color in the generated image due to the prevention of the phase inversion phenomenon. Moreover, by setting the transimpedance gain G as high as possible and causing the band frequency B to substantially correspond with the maximum value of the signal frequency of light, unnecessary amplification of a current with a high frequency is prevented while a current of the necessary frequency band is amplified, so that an image with less noise can be acquired. In addition, the current of the necessary high frequency band is prevented from being amplified with distortion, and an image with high resolution can be acquired.

Figure 3:
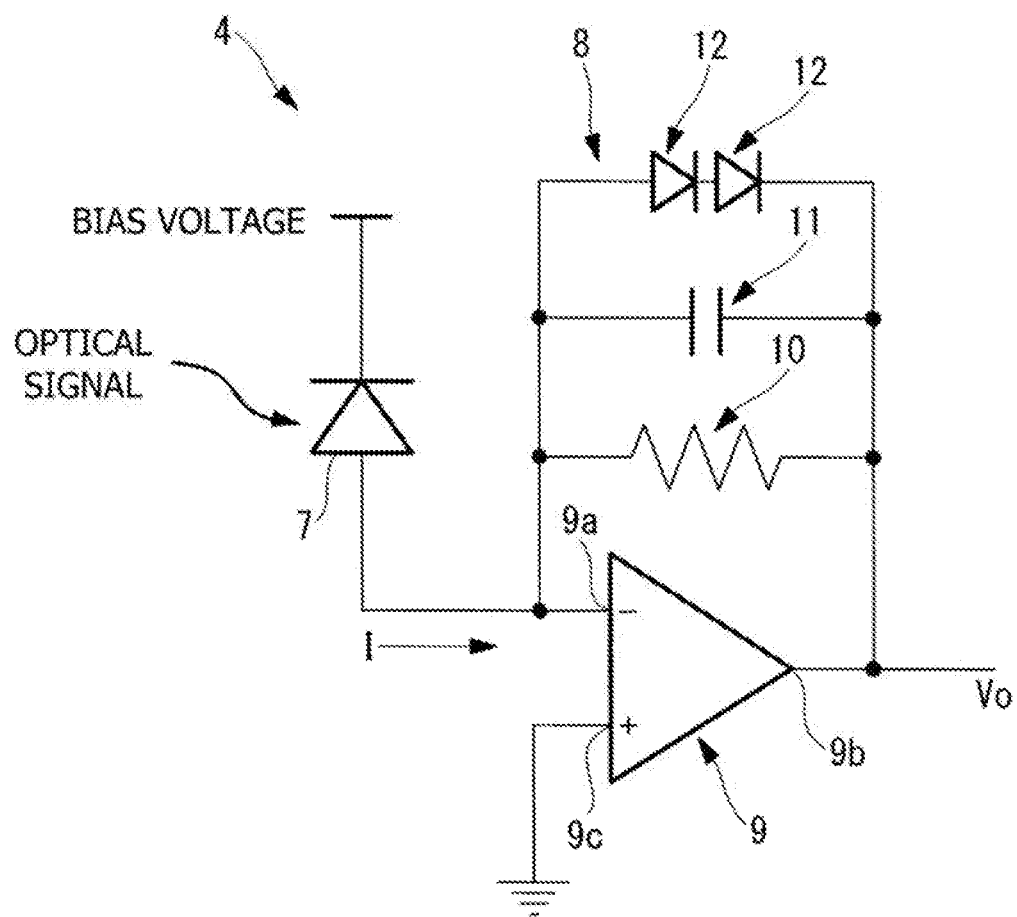
FIG. 3 is a circuit diagram representing a modification example of the light detecting apparatus of FIG. 2.

In the present embodiment, the case in which the number of diodes 12 is set to n=1 is exemplified. However, instead of this, at least two diodes 12 may be arranged in series as represented in FIG. 3.

When n (n≥2) diodes 12 are connected in series, from expression (2), the influence given to the band frequency B by the capacitance value $C_d$ of the diode 12 can be reduced to 1/n. That is, because the capacitance of the diode 12 involves manufacturing variation, variation in the band frequency B due to the manufacturing variation can be prevented by connecting the diodes 12 in series.

As a result, there is an advantage that it is possible to more surely prevent distortion in a high frequency band attributed to the lowering of the band frequency B beyond the signal frequency band of light desired to be detected due to the variation and the lowering of the signal-to-noise ratio due to increase in the band frequency B and amplification of a current of a high frequency band beyond necessity.

For example, the capacitance of the diode 12 including variation is defined as $(C_d + \delta C_d)$. Here, $C_d$ is a design value and $\delta C_d$ is a variation value.

The band frequency B when the number of diodes 12 is one is as represented in Math. 1 and the band frequency B when the number of diodes 12 is n is as represented in Math. 2.

Here, when the diodes 12 are connected in series, the capacitance value $C_d$ of the diodes 12 decreases. To compensate for this reduction, the capacitance value $C_f$ is set to new value $C_f 2$.

$$B = \frac{1}{2\Pi R_f (C_f + C_d + \delta C_d)} = \frac{1}{2\Pi R_f (C_f + C_d)} \times \frac{1}{1 + \frac{\delta C_d}{C_f + C_d}} \quad \text{[Math. 1]}$$

$$B = \frac{1}{2\Pi R_f \left(C_f 2 + \frac{C_d}{n} + \frac{\delta C_d}{n}\right)} = $$

$$\frac{1}{2\Pi R_f \left(C_f 2 + \frac{C_d}{n}\right)} \times \frac{1}{1 + \frac{\frac{\delta C_d}{n}}{C_f 2 + \frac{C_d}{n}}}$$

When Math. 1 and Math. 2 are compared, it turns out that the variation amount is reduced to 1/n due to the change of the number of diodes 12 to n.

When concrete numerical values are applied, for example, if the number of diodes 12 is n=1,
supposing that $C_f$=800, $C_d$=200, and $\delta C_d$=100,
the term of the variation at the end of Math. 1 is 1/10.

If the number of diodes 12 is n=4, when $C_f 2$=950, $C_d$=200, and $\delta C_d$=100 are set in order to equalize the band frequency based on the design value with the band frequency described hereinbefore,
the term of the variation at the end of Math. 2 is 1/40.

Due to this, the capacitance value of the feedback capacitance 11 whose capacitance value is managed can be set large and the variation in the band frequency B can be greatly reduced.

Furthermore, when the output voltage $V_O$ is applied to the diodes 12, a leakage current $I_f$ flows into the diodes 12. As the output voltage becomes higher, this leakage current $I_f$ becomes larger and deteriorates the linearity of the transimpedance gain G There is also an advantage that, due to the connection of the n diodes 12 in series, the voltage applied to each diode 12 can be divided to be suppressed to 1/n and the deterioration of the linearity of the transimpedance gain G can be prevented.

Figure 4:
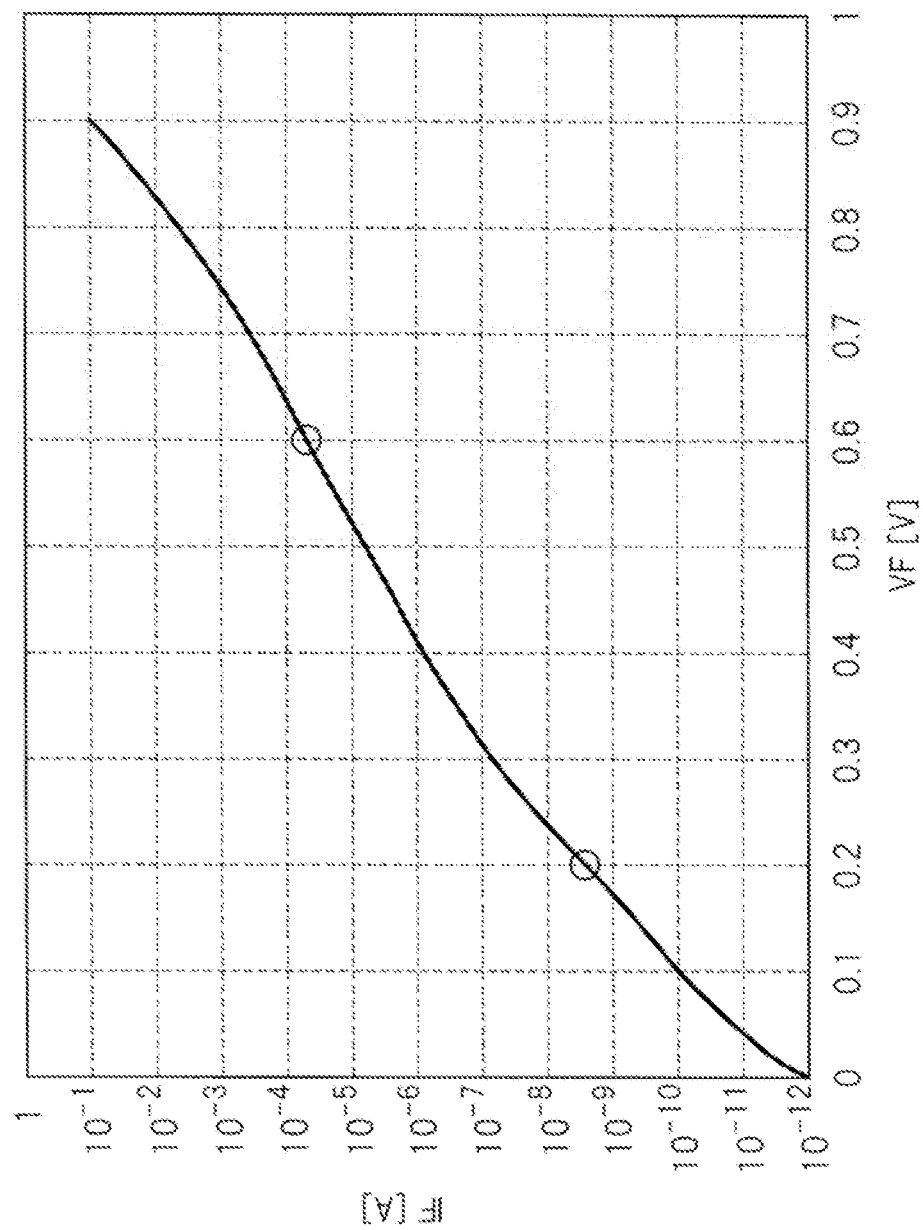
FIG. 4 is a graph representing the voltage characteristic of a general leakage current of a diode.

As represented in FIG. 4, if the output voltage $V_O$ is −0.6 V, when the number of diodes 12 is one, the leakage current $I_f$ is approximately 50 μA. However, when three diodes 12 are connected in series, the voltage applied to one diode 12 becomes −0.2 V and the leakage current $I_f$ becomes approximately 30 nA and can be suppressed to a sufficiently-low current.

Furthermore, in the present embodiment, the image acquiring apparatus 1 of an optical fiber scanning type is exemplified. However, the disclosed technology is not limited thereto.

One aspect of the disclosed technology is directed to a light detecting apparatus used in an image acquiring apparatus. The image acquiring apparatus comprises a light receiving element that outputs a current according to a light amount of incident light. A current-voltage conversion circuit converts the current output from the light receiving element to a voltage signal. The current-voltage conversion circuit includes an operational amplifier and feedback resistance, feedback capacitance, and at least one diode that are connected in parallel between an inverting terminal and an output terminal of the operational amplifier. The diode is connected to have a forward direction from the inverting terminal toward the output terminal, and
following conditional expressions are satisfied, $$G=R_f \tag{1}$$

$$B=1/(2\pi R_f(C_f+C_d/n)) \tag{2}$$

$$V_{pr}>n\times V_f>G\times I_{max} \tag{3}$$

where
G is transimpedance gain of the current-voltage conversion circuit,
$R_f$ is a resistance value of the feedback resistance,
B is a desired band frequency,
$C_f$ is a capacitance value of the feedback capacitance,
$C_d$ is a capacitance value of the diode,
n is the number of diodes,
$V_{pr}$ is a voltage at which the operational amplifier causes an abnormality,
$V_f$ is a forward voltage of the diode, and
$I_{max}$ is a current value output from the light receiving element when incidence of a maximum value of a light amount desired to be detected is made and wherein when an excessive current is input, the operational amplifier is prevented from causing a phase inversion phenomenon.

Another aspect of the disclosed technology is directed to an image acquiring apparatus. The image acquiring apparatus comprises a light detecting apparatus having a light receiving element that outputs a current according to a light amount of incident light. A current-voltage conversion circuit converts the current output from the light receiving element to a voltage signal. The current-voltage conversion circuit includes an operational amplifier and feedback resistance, feedback capacitance, and at least one diode that are connected in parallel between an inverting terminal and an output terminal of the operational amplifier. The diode is connected to have a forward direction from the inverting terminal toward the output terminal, and
following conditional expressions are satisfied, $$G=R_f \tag{1}$$

$$B=1/(2\pi R_f(C_f+C_d/n)) \tag{2}$$

$$V_{pr}>n\times V_f>G\times I_{max} \tag{3}$$

where
G is transimpedance gain of the current-voltage conversion circuit,
$R_f$ is a resistance value of the feedback resistance,
B is a desired band frequency,
$C_f$ is a capacitance value of the feedback capacitance,
$C_d$ is a capacitance value of the diode,
n is the number of diodes,
$V_{pr}$ is a voltage at which the operational amplifier causes an abnormality,
$V_f$ is a forward voltage of the diode, and
$I_{max}$ is a current value output from the light receiving element when incidence of a maximum value of a light amount desired to be detected is made and wherein when an excessive current is input, the operational amplifier is prevented from causing a phase inversion phenomenon. An image processing portion generates an image based on the voltage signal output from the light detecting apparatus so as to prevent the occurrence of a false color in the generated image due to the prevention of the phase inversion phenomenon.

A further aspect of the disclosed technology is directed to a light detecting apparatus used in an image acquiring apparatus. The image acquiring apparatus comprises a light receiving element that outputs a current according to a light amount of incident light. A current-voltage conversion circuit converts the current output from the light receiving element to a voltage signal. The current-voltage conversion circuit includes an operational amplifier and feedback resistance, feedback capacitance, and at least one diode that are connected in parallel between an inverting terminal and an output terminal of the operational amplifier. The at least one diode is connected to have a forward direction from the inverting terminal toward the output terminal. The light detecting apparatus outputs a detection signal based on the light amount when the light amount is within a predetermined range and the light detecting apparatus prevents a phase inversion phenomenon caused by the operational amplifier when the light amount is beyond the predetermined range.

The current-voltage conversion circuit satisfies the following conditional expressions (1) to (3) and wherein $$G = R_f \quad (1)$$

$$B = 1/(2\pi R_f(C_f + C_d/n)) \quad (2)$$

$$V_{pr} > n \times V_f > G \times I_{max} \quad (3)$$

where

G is transimpedance gain of the current-voltage conversion circuit, $R_f$ is a resistance value of the feedback resistance, B is a desired band frequency, $C_f$ is a capacitance value of the feedback capacitance, $C_d$ is a capacitance value of the diode, n is the number of diodes, $V_{pr}$ is a voltage at which the operational amplifier causes an abnormality, $V_f$ is a forward voltage of the diode, and $I_{max}$ is a current value output from the light receiving element when incidence of a maximum value of a light amount desired to be detected is made. The light amount surpasses a normal light amount range due to flowing of the current output from the light receiving element to the feedback resistance. The at least one diode becomes conductive at the timing when a voltage drop between the inverting terminal and the output terminal reaches a forward voltage $V_f$ of the diode. An output voltage $V_0$ is clipped around the forward voltage $V_f$ such that the output voltage $V_0$ does not surpass the forward voltage $V_f$ even when the current output from the light receiving element becomes larger and does not reach a voltage $V_{pr}$, at which the operational amplifier causes an abnormality.

While various embodiments of the disclosed technology have been described above, it should be understood that they have been presented by way of example only, and not of limitation. Likewise, the various diagrams may depict an example schematic or other configuration for the disclosed technology, which is done to aid in understanding the features and functionality that can be included in the disclosed technology. The disclosed technology is not restricted to the illustrated example schematic or configurations, but the desired features can be implemented using a variety of alternative illustrations and configurations. Indeed, it will be apparent to one of skill in the art how alternative functional, logical or physical locations and configurations can be implemented to implement the desired features of the technology disclosed herein.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one", "one or more" or the like; and adjectives such as "conventional", "traditional", "normal", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more", "at least", "but not limited to" or other like phrases in some instances shall not be read to mean that the narrower case is intended or required in instances where such broadening phrases may be absent. Additionally, the various embodiments set forth herein are described in terms of exemplary schematics, block diagrams, and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular configuration.

NUMERAL REFERENCE LIST

1 Image acquiring apparatus
4 Light detecting apparatus
5 Image processing portion
7 Light receiving element
8 Current-voltage conversion circuit
9 Operational amplifier
9a Inverting terminal
9b Output terminal
10 Feedback resistance
11 Feedback capacitance
12 Diode

What is claimed is:

1. A light detecting apparatus used in an image acquiring apparatus comprising:
   a light receiving element that outputs a current according to a light amount of incident light, and
   a current-voltage conversion circuit that converts the current output from the light receiving element to a voltage signal,
   wherein
   the current-voltage conversion circuit includes an operational amplifier and feedback resistance, feedback capacitance, and at least one diode that are connected in parallel between an inverting terminal and an output terminal of the operational amplifier,
   the diode is connected to have a forward direction from the inverting terminal toward the output terminal, and
   following conditional expressions are satisfied, $$G = R_f \quad (1)$$

$$B = 1/(2\pi R_f(C_f + C_d/n)) \quad (2)$$

$$V_{pr} > n \times V_f > G \times I_{max} \quad (3)$$

where
- G is transimpedance gain of the current-voltage conversion circuit,
- $R_f$ is a resistance value of the feedback resistance,
- B is a desired band frequency,
- $C_f$ is a capacitance value of the feedback capacitance,
- $C_d$ is a capacitance value of the diode,
- n is the number of diodes,
- $V_{pr}$ is a voltage at which the operational amplifier causes an abnormality,
- $V_f$ is a forward voltage of the diode, and
- $I_{max}$ is a current value output from the light receiving element when incidence of a maximum value of a light amount desired to be detected is made and wherein when an excessive current is input, the operational amplifier is prevented from causing a phase inversion phenomenon.

2. The light detecting apparatus of claim 1, wherein the at least one diode includes a plurality of the diodes that are connected in series.

3. An image acquiring apparatus comprising:
a light detecting apparatus having
 a light receiving element that outputs a current according to a light amount of incident light, and
 a current-voltage conversion circuit that converts the current output from the light receiving element to a voltage signal,
wherein
the current-voltage conversion circuit includes an operational amplifier and feedback resistance, feedback capacitance, and at least one diode that are connected in parallel between an inverting terminal and an output terminal of the operational amplifier,
the diode is connected to have a forward direction from the inverting terminal toward the output terminal, and
following conditional expressions are satisfied, $$G=R_f \tag{1}$$

$$B=1/(2\pi R_f(C_f+C_d/n)) \tag{2}$$

$$V_{pr}>n\times V_f>G\times I_{max} \tag{3}$$

where
- G is transimpedance gain of the current-voltage conversion circuit,
- $R_f$ is a resistance value of the feedback resistance,
- B is a desired band frequency,
- $C_f$ is a capacitance value of the feedback capacitance,
- $C_d$ is a capacitance value of the diode,
- n is the number of diodes,
- $V_{pr}$ is a voltage at which the operational amplifier causes an abnormality,
- $V_f$ is a forward voltage of the diode, and
- $I_{max}$ is a current value output from the light receiving element when incidence of a maximum value of a light amount desired to be detected is made and wherein when an excessive current is input, the operational amplifier is prevented from causing a phase inversion phenomenon; and
an image processing portion that generates an image based on the voltage signal output from the light detecting apparatus so as to prevent the occurrence of a false color in the generated image due to the prevention of the phase inversion phenomenon.

4. The image acquiring apparatus of claim 3, wherein the at least one diode includes a plurality of the diodes that are connected in series.

5. A light detecting apparatus used in an image acquiring apparatus comprising:
a light receiving element that outputs a current according to a light amount of incident light, and
a current-voltage conversion circuit that converts the current output from the light receiving element to a voltage signal, the current-voltage conversion circuit including an operational amplifier and feedback resistance, feedback capacitance, and at least one diode that are connected in parallel between an inverting terminal and an output terminal of the operational amplifier, the at least one diode being connected to have a forward direction from the inverting terminal toward the output terminal, wherein
the light detecting apparatus outputs a detection signal based on the light amount when the light amount is within a predetermined range and the light detecting apparatus prevents a phase inversion phenomenon caused by the operational amplifier when the light amount is beyond the predetermined range.

6. The light detecting apparatus of claim 5, wherein the current-voltage conversion circuit satisfies the following conditional expressions (1) to (3) and wherein $$G=R_f \tag{1}$$

$$B=1/(2\pi R_f(C_f+C_d/n)) \tag{2}$$

$$V_{pr}>n\times V_f>G\times I_{max} \tag{3}$$

where
- G is transimpedance gain of the current-voltage conversion circuit,
- $R_f$ is a resistance value of the feedback resistance,
- B is a desired band frequency,
- $C_f$ is a capacitance value of the feedback capacitance,
- $C_d$ is a capacitance value of the diode,
- n is the number of diodes,
- $V_{pr}$ is a voltage at which the operational amplifier causes an abnormality,
- $V_f$ is a forward voltage of the diode, and
- $I_{max}$ is a current value output from the light receiving element when incidence of a maximum value of a light amount desired to be detected is made.

7. The light detecting apparatus of claim 5, wherein the light amount surpasses a normal light amount range due to flowing of the current output from the light receiving element to the feedback resistance, the at least one diode becomes conductive at the timing when a voltage drop between the inverting terminal and the output terminal reaches a forward voltage $V_f$ of the diode.

8. The light detecting apparatus of claim 7, wherein an output voltage $V_O$ is clipped around the forward voltage $V_f$ such that the output voltage $V_O$ does not surpass the forward voltage $V_f$ even when the current output from the light receiving element becomes larger and does not reach a voltage $V_{pr}$, at which the operational amplifier causes an abnormality.

* * * * *